United States Patent
Jennings et al.

(10) Patent No.: US 7,777,577 B2
(45) Date of Patent: Aug. 17, 2010

(54) DUAL PATH PHASE LOCKED LOOP (PLL) WITH DIGITALLY PROGRAMMABLE DAMPING

(75) Inventors: Richard Ellis Jennings, Garland, TX (US); Md Anwar Sadat, Plano, TX (US); John Thomas Wilson, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 49 days.

(21) Appl. No.: 12/195,514

(22) Filed: Aug. 21, 2008

(65) Prior Publication Data

US 2009/0085679 A1    Apr. 2, 2009

Related U.S. Application Data

(60) Provisional application No. 60/975,873, filed on Sep. 28, 2007.

(51) Int. Cl.
*H03L 7/085*    (2006.01)
*H03L 7/093*    (2006.01)

(52) U.S. Cl. .......................... 331/17; 331/25; 327/156; 327/157

(58) Field of Classification Search ................. 331/1 A, 331/8, 10, 11, 14, 17, 18, 25; 327/156–159
See application file for complete search history.

(56) References Cited

U.S. PATENT DOCUMENTS 5,218,363 A * 6/1993 LeCroy et al. .............. 341/123

OTHER PUBLICATIONS

Behzad Razavi, "Design of Analog CMOS Integrated Circuits", pp. 533-562, McGraw-Hill, 2000.
Floyd Gardner, "Phaselock Techniques", pp. 17-19, Wiley-Interscience, 2005.
ALS Loke, RK Barnes, TT Wee, MM Oshima, CE Moore, RR Kennedy, MJ Gilsdorf, "A Versatile 90-nm CMOS Charge-Pump PLL for SerDes Transmitter Clocking", IEEE Journal of Solid State Circuits, Aug. 2006, p. 1894-1897.
J Craninckx and M Steyaert, "A fully integrated CMOS DCS—1800 frequency synthesizer", IEEE Journal of Solid State Circuits, Dec. 1998, p. 2054-2065.

* cited by examiner

*Primary Examiner*—David Mis
(74) *Attorney, Agent, or Firm*—Dawn V. Stephens; Wade James Brady, III; Frederick J. Telecky, Jr.

(57) ABSTRACT

In a method and apparatus for controlling damping and bandwidth in a phase locked loop (PLL), a loop filter is configured to have a dual path for charge pump current. A 3 dB bandwidth of the PLL is controlled by adjusting gain of a proportional current path. An integral current path includes a gating circuit to digitally control an amount of time an integral charge pump current received is passed through as an effective integral charge pump current. A resistor and capacitor (RC) circuit filters the proportional and effective integral charge pump currents, thereby providing a filtered input to a voltage controlled oscillator. Damping and hence peaking of the PLL is precisely controlled by sampling one of every p samples of the integral charge pump current to provide the effective integral charge pump current, p being an integer.

20 Claims, 5 Drawing Sheets

FIG. 4

TABLE 400

| | 3 dB BANDWIDTH | PEAKING (dB) |
|---|---|---|
| 410 — PLL 100 | 780KHz | 1.53 |
| 420 — PLL 200 WITH N = 1/4 | 740 KHz | .469 |
| 430 — PLL 200 WITH N = 1/16 | 600 KHz | .156 |

TABLE 440

| COMPONENTS | | | | |
|---|---|---|---|---|
| R | N | C2 | Kv | ICP |
| 1 K | 10 | 1E-15F | 1E9 Hz/V | 1E-4 A |

TABLE 450

| | SAMPLING | | S DOMAIN ANALYSIS | | |
|---|---|---|---|---|---|
| C1 | A1 (INTEG) | A2 (PROP) | F3dB | PEAKING (dB) | Fpk |
| 1.00E-09 | 1 | 1 | 1.75E+06 | 0.597 | 300KHz |
| 2.00E-09 | 1 | 1 | 1.67E+06 | 0.328 | 190KHz |
| 5.00E-10 | 1 | 1 | 1.90E+06 | 1.049 | 480KHz |
| 2.50E-10 | 1 | 1 | 2.18E+06 | 1.78 | 766KHz |
| | | | | | |
| 1.00E-09 | 1 | 1 | 1.75E+06 | 0.597 | 300KHz |
| 1.00E-09 | 2 | 1 | 1.90E+06 | 1.048 | 500KHz |
| 1.00E-09 | 0.5 | 1 | 166E+06 | 0.329 | 190KHz |
| 1.00E-09 | 0.25 | 1 | 1.62E+06 | 0.177 | 110KHz |
| | | | | | |
| 2.50E-10 | 1 | 1 | 2.18E+06 | 1.78 | 766KHz |
| 2.50E-10 | .0.5 | 1 | 1.90E+06 | 1.048 | 500KHz |
| 2.50E-10 | 0.25 | 1 | 1.75E+06 | 0.596 | 300KHz |
| 2.50E-10 | 0.125 | 1 | 1.65E+06 | 0.329 | 185KHz |
| 2.50E-10 | 0.0625 | 1 | 1.63E+06 | 0.177 | 110KHz |

Groupings: 452 (first 4 data rows), 454 (next 4 data rows), 456 (last 5 data rows)

DUAL PATH PHASE LOCKED LOOP (PLL) WITH DIGITALLY PROGRAMMABLE DAMPING

CROSS REFERENCE TO RELATED APPLICATIONS

This application claims benefit of priority from U.S. Provisional Application No. 60/975,873 filed Sep. 28, 2007, entitled 'Dual Path PLL With Digitally Programmable Damping', which is hereby incorporated herein in its entirety.

BACKGROUND

The present invention is related in general to the field of electronic circuits, and more specifically to an apparatus and method for improved damping control of a loop filter included in a phase locked loop (PLL).

A traditional PLL is a well-known electronic circuit used in many semiconductor devices. PLL circuits are typically used for frequency/timing control in a variety of applications including clocks, frequency multipliers, demodulators, tracking generators, and clock recovery circuits. A PLL is a closed loop feedback control circuit which provides an output signal that is locked in phase and frequency of an input signal used as a reference. FIG. 1 is a simplified block diagram of a traditional type II phase locked loop 100, according to prior art. The PLL 100 includes a phase frequency detector (PFD) 110, a charge pump (CP) 120, a loop filter 130, a voltage-controlled oscillator (VCO) 140, and an optional divider 150. The PFD 110 compares a feedback signal 112 received from the divider 150 with a reference signal 102 and generates an error signal 104 which is proportional to the magnitude of the phase/frequency difference between them. The error signal 104 is provided to the CP 120. The CP 120 provides a current output to control the charge stored in the loop filter 130, thus converting the output of the PFD 110 to a control voltage input 106 recognizable by the VCO 140. The loop filter 130 filters out undesirable higher frequencies, glitches, spurious noise, spurs and the like from the CP 120 current output signal. The VCO 140 generates an output frequency signal 108 proportional to the control voltage input 106. The output frequency signal 108 may be optionally further divided down by the divider 150 before being fed back to the PFD 110. When the PLL 100 is "locked", there is a constant phase difference (usually zero) between the feedback signal 112 and a reference signal 102 and their frequencies are matched.

It is well known that performance and stability of the traditional PLL is often controlled by the following PLL parameters: 1) natural frequency or loop bandwidth (Wn), 2) damping factor (zeta), and 3) the 3 dB bandwidth. The 3 dB bandwidth is a measure of the frequency range within which the PLL is able to track frequency changes of the reference signal 102. For a PLL loop having a large damping factor zeta, the 3 dB bandwidth is approximately equal to 2*zeta*Wn. The damping factor zeta determines the responses of phase or frequency error steps applied to the input of the PLL. Zeta may be adjusted to achieve a fast response or small overshoot and minimum phase noise bandwidth. If zeta is very small, a large overshoot and an increased phase jitter may occur. If zeta is too large, the response may become sluggish resulting in increased time to lock the PLL. Many PLL loops may be configured to have a damping factor typically varying between approximately 0.7 and approximately 2. The peaking of a loop is inversely proportional to the damping factor zeta. Many modern broadband communication system applications such as a Gigabyte Passive Optical Network (GPON) often specify a PLL having a small 3 dB bandwidth (e.g., 0.5 megahertz) and stringent peaking (e.g., less than 0.1 dB) specifications. Therefore, being inversely proportional, it is a challenge to minimize both 3 dB bandwidth and peaking specifications of a PLL.

The loop filter 130 may be implemented using passive components such as a passive resistor capacitor (RC) circuit or may be implemented using an active component such as an operational amplifier (OA or opamp) used in combination with an RC circuit. For simultaneous compliance with low bandwidth and low peaking specifications, a large value of a capacitor may be required to provide a lower zero frequency of the loop filter 130. However, a capacitor having a large value consumes a significant portion of silicon chip area. In some conventional loop filters, the large value for the capacitor may force the use of an off-chip fabricated component, e.g., use as an externally mounted capacitor component.

A known solution to improve control of bandwidth and peaking parameters of a PLL is to utilize a traditional dual path loop filter architecture (not shown) in which the charge pump current is split into two paths—a proportional path powered by a proportional charge pump and an integral path powered by an integral charge pump. The dual path PLL design enables bandwidth adjustment by controlling gain in the proportional path and enables damping adjustment by controlling gain in the integral path. However, the accuracy of controlling gain in each of the two paths, especially the integral path, is limited by various factors including inability to reduce integral charge pump current below a practical level (generation of very small charge pump current may result in dead zone, jitter and phase noise problems), device mismatch, process variation, and increased integral charge pump current error due to transistor current leakage. In addition, inclusion of a floating capacitor in the integral path often results in increasing the silicon area of the loop filter and the PLL.

SUMMARY

Applicants recognize an existing need for an apparatus and method for improved damping control of a dual path loop filter in a PLL, absent the disadvantages found in the prior art techniques discussed above. PLL parameters such as 3 dB bandwidth and peaking value may experience a wider spread in their values (e.g., 0.05 to 0.5 dB for peaking) in deep submicron technology applications due to increasing mismatch between devices and wider spread in process corners. Precise control in broadband communication applications such as GPON is desired since several PLL repeaters may be cascaded together and any increase in peaking of a PLL is magnified N times for the N repeaters. Applicants also recognize an existing need for the improved apparatus and method for damping to provide: 1) digital controls for precisely controlling integral charge pump current flowing through the integral path, thereby providing accurate peaking, 2) a reduced value capacitor in the integral path to significantly reduce the silicon area/die size of the loop filter and the PLL, 3) a narrow bandwidth without increasing a size of the integrating capacitor, 4) balanced currents provided by the integral charge pump and the proportional charge pump, thereby avoiding generating very small charge pump currents or imbalanced currents that may be more vulnerable to mismatch and process variation, and 5) independent controls for bandwidth and damping, preferably without incurring a penalty on the silicon area/die size.

The foregoing need is addressed by the teachings of the present disclosure, which relates to an apparatus and method for independently and simultaneously controlling damping and bandwidth in a PLL. According to one embodiment, in a method and apparatus for controlling damping and bandwidth in a phase locked loop (PLL), a loop filter is configured to have a dual path for charge pump current. A 3 dB bandwidth of the PLL is controlled by adjusting gain of a proportional current path. An integral current path includes a gating circuit to digitally control an amount of time an integral charge pump current received is passed through as an effective integral charge pump current. A resistor and capacitor (RC) circuit filters the proportional and effective integral charge pump currents, thereby providing a filtered input to a voltage controlled oscillator. Damping and hence peaking of the PLL is precisely controlled by sampling one of every p samples of the integral charge pump current to provide the effective integral charge pump current, p being an integer.

In one aspect of the disclosure, a method for integrating an integral charge pump current includes receiving the current, and sampling one of every p samples of the current to provide an effective integral charge pump current, p being an integer. The sampling is performed digitally to obtain a precise ratio between the effective integral charge pump current and the integral charge pump current. A charge provided by the effective integral charge pump current is integrated by using a capacitor. The charge is retained by disabling a discharge path for the charge to an integral charge pump by placing a unity gain buffer between the capacitor and the integral charge pump.

Several advantages are achieved by the method and apparatus according to the illustrative embodiments presented herein. The embodiments advantageously provide an improved apparatus and method for independent control of 3 dB bandwidth and digital control of damping of a dual path PLL without incurring a penalty in terms of silicon area/die size. The digital control for damping includes a gating circuit to control a fraction of the time (defined as a gating factor n) for which an integral charge pump current is passed through to an integrating capacitor of an RC circuit. The digital control for precisely controlling the integral charge pump current flowing through the integral path is defined by selecting a value of n, n being a ratio of 1 divided by an integer p. This provides accurate peaking of the PLL, thereby enabling compliance with stringent peaking specifications such as 0.1 dB or less. Compared to the traditional analog solution in a dual path PLL, the digital controls provide improved tolerance towards device mismatch, process variation, and integral charge pump current error due to transistor current leakage. The improved loop filter draws identical currents from the proportional charge pump and the integral charge pump, thereby eliminating imbalanced currents that are more vulnerable to mismatch and process variation. The improved apparatus and method also provides the benefit of reducing the size of a capacitance used as an integrator, potentially reducing the silicon area of the capacitance by a factor of p or eliminating the need for a large value capacitor mounted external to the silicon device package. That is, by using digital controls for damping the silicon area/die size for an existing PLL circuit can be reduced by a factor of p without substantially impacting bandwidth and damping factor.

BRIEF DESCRIPTION OF THE DRAWINGS

FIG. 4 includes tabular data illustrating effect of adjusting gating factor n and size of integrating capacitor on performance of PLL described with reference to FIGS. 2, 3A, 3B, and 3C, according to an embodiment;

DETAILED DESCRIPTION

Figure 1:
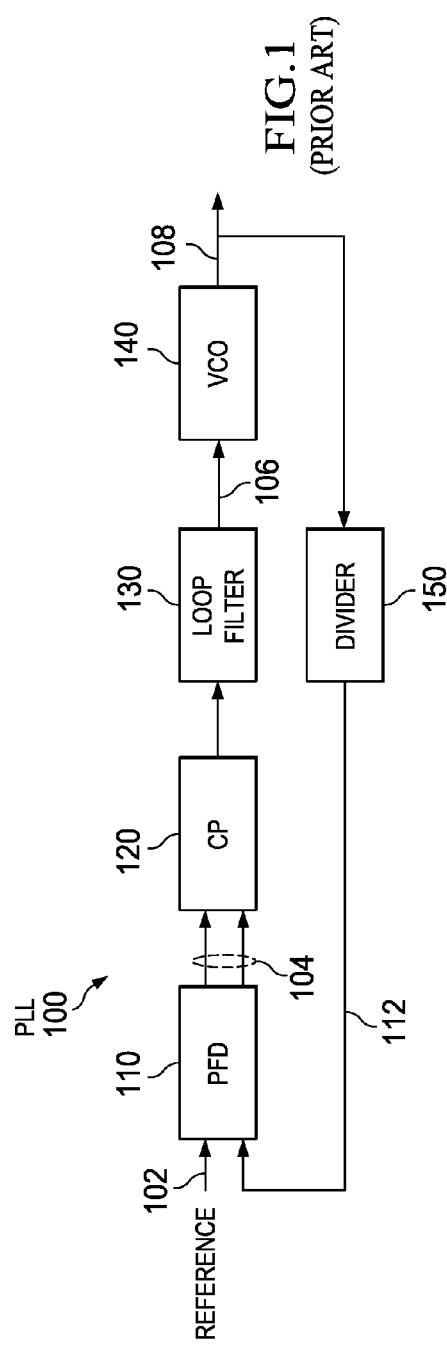
FIG. 1 is a simplified block diagram of a type II phase-locked loop, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Traditional and prior art loop filters used in a PLL, built using RC circuits with or without active components, have a trade off between controlling gain in the integral path, size of the capacitance, and the damping. Lowering the peaking and hence increasing the damping of a loop filter response is typically achieved by using a smaller integral charge pump current relative to the proportional charge pump current. The peaking may also be reduced by increasing the size of the integral capacitor. However, the accuracy of controlling the gains in the two paths, especially controlling the gain in the integral path, is limited by various factors including ability to reduce integral charge pump current below a practical level, device mismatch, process variation, and integral charge pump current error due to transistor current leakage. Increasing the size of the integral capacitor also increases the size of the silicon area/die size and increases total current leakage. In addition, inclusion of a floating capacitor in the integral path also increases the silicon area of the loop filter and the PLL. These problems, among others, may be addressed by an improved apparatus and method for controlling loop filter response.

According to an embodiment, in a method and apparatus for controlling damping and bandwidth in a phase locked loop (PLL), a loop filter is configured to have a dual path for charge pump current. A 3 dB bandwidth of the PLL is controlled by adjusting the gain of a proportional current path. An integral current path includes a gating circuit to digitally control an amount of time an integral charge pump current received is passed through as an effective integral charge pump current. A resistor and capacitor (RC) circuit filters the proportional and effective integral charge pump currents, thereby providing a filtered input to a voltage controlled oscillator. Damping and hence peaking of the PLL is precisely controlled by sampling one of every p samples of the integral charge pump current to provide the effective integral charge pump current, p being an integer. A loop filter apparatus for precisely controlling damping is described with reference to FIGS. 2, 3A, 3B, 3C, 4, 5A and 5B.

The following terminology may be useful in understanding the present disclosure. It is to be understood that the terminology described herein is for the purpose of description and should not be regarded as limiting. The term 'exemplary' is used herein to mean "serving as an example, instance, or illustration." Any embodiment or design described herein as 'exemplary' is not necessarily to be construed as preferred or advantageous over other embodiments or designs.

Semiconductor Device—A semiconductor device is an electronic component that utilizes electronic properties of semiconductor materials to perform a desired function. A semiconductor device may be manufactured as a single discrete device or as one or more ICs packaged into a module.

Phase Noise—Phase noise is a measure of variation in signal timing, but the results are displayed in the frequency domain. In an oscillator circuit, phase noise is described as the random fluctuations in the phase of a signal that may be typically caused by time domain uncertainties. The effect of phase noise causes timing jitter on the zero crossings of the waveform of the signal.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, for obtaining a desired bandwidth, a resistance value for an RC circuit may be configured to be equal to 5 kilo ohms.

Figure 2:
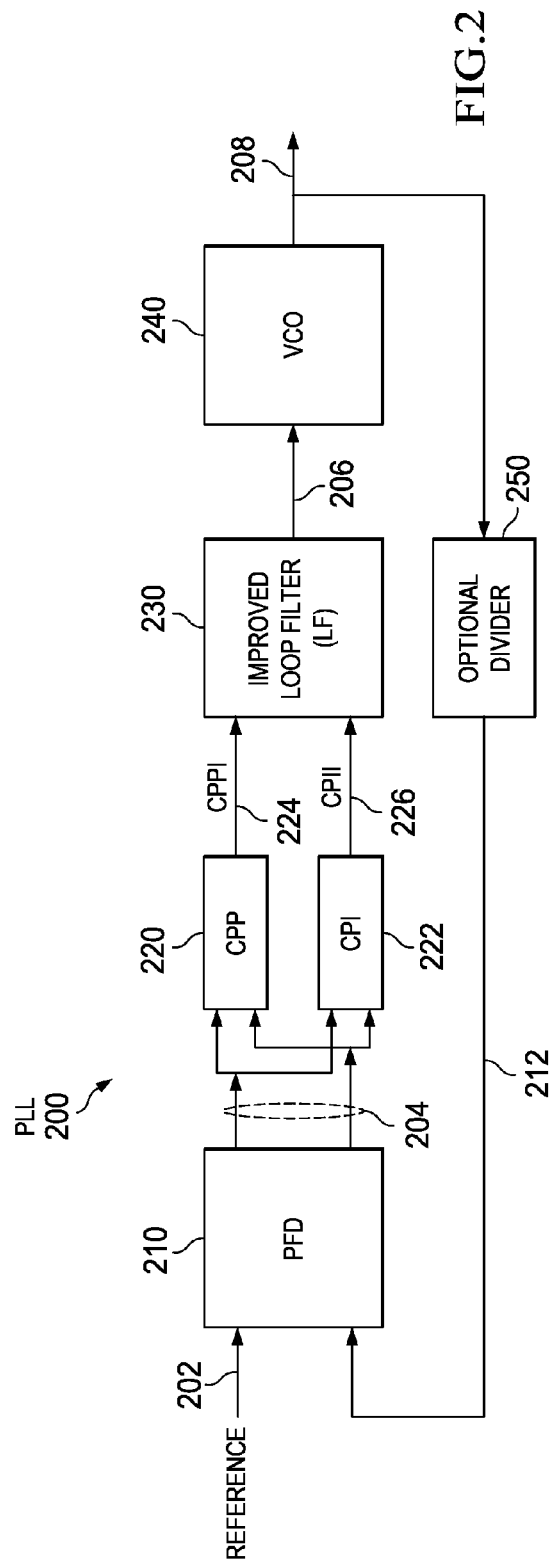
FIG. 2 is a block diagram of a phase locked loop (PLL) having an improved loop filter (LF), according to an embodiment.

FIG. 2 is a block diagram of a phase locked loop (PLL) 200 having an improved loop filter (LF) 230, according to an embodiment. The PLL 200 also includes a PFD 210, dual charge pumps (CPP 220 and CPI 222), a VCO 240, and an optional divider 250. In a particular embodiment, the architecture of the PLL 200 is similar to the PLL 100 described with reference to FIG. 1 except for the improved loop filter (LF) 230 and the dual charge pumps CPP 220 and CPI 222. The PLL 200 provides significantly improved performance such as peaking and a reduction in silicon area compared to the PLL 100.

In an exemplary, non-depicted embodiment, the PLL 200 is a type II dual loop third order system. LF 230 uses a dual path loop filter architecture (having a proportional path and an integral path) and includes digital controls to precisely control damping (and hence peaking) of the PLL 200. The PLL 200 having digital controls for the LF 230 also provides a substantial reduction in the silicon size/die area compared to the PLL 100 having the traditional loop filter 130, both the PLL's being configured to provide a similar peaking value. The reduction in the silicon size/die area is adjustable by a configurable factor n. In a particular embodiment, the PLL 200 and the LF 230 having the reduced silicon area may be implemented as an integrated semiconductor device, as separate semiconductor devices, or may be integrated as a portion of a larger integrated circuit chip. Additional details of the LF 230 are described with reference to FIGS. 3A, 3B, 3C, 4, 5A and 5B.

The PFD 210 compares a feedback signal 212 received from the optional divider 250 with a reference signal 202 and generates an error signal 204 which is proportional to the magnitude of the phase/frequency difference between them. The error signal 204, which may include positive/up and negative/down pulses, is provided to both the CPP 220 and CPI 222 charge pumps. The CPP 220 and CPI 222 charge pumps respectively provide a proportional charge pump current (CPPI) 224 output and an integral charge pump current (CPII) 226 output to control a magnitude of the charge stored in the LF 230, thus converting the output of the PFD 210 to a voltage input 206 recognizable by the VCO 240. The LF 230 filters out undesirable higher frequencies, glitches, spurious noise, spurs and the like from the proportional and integral charge pump currents. The VCO 240 generates an output frequency signal 208 proportional to the voltage input 206. The output frequency signal 208 may be optionally further divided down by the divider 250 before being fed back to the PFD 210. When the PLL 200 is "locked", there is a constant phase difference (usually zero) between the feedback signal 212 and a reference signal 202 and their frequencies are matched.

Figure 3A:
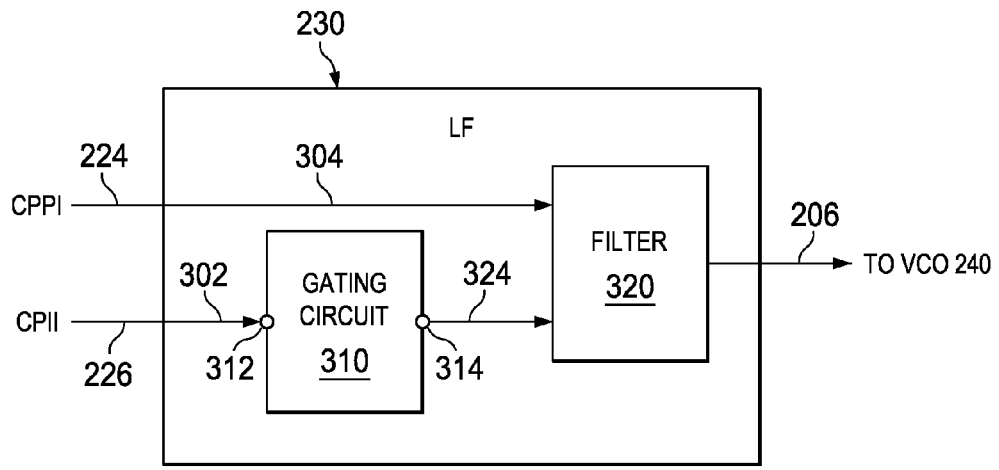
FIG. 3A is a simplified block diagram of an improved loop filter (LF) described with reference to FIG. 2, according to an embodiment.

FIG. 3A is a simplified block diagram of an improved loop filter (LF) 230 described with reference to FIG. 2, according to an embodiment. FIG. 3B is a simplified circuit diagram of a gating circuit 310 and a filter 320 included in the LF 230 described with reference to FIG. 3A, according to an embodiment. Referring to FIGS. 3A and 3B, the LF 230 includes a gating circuit 310 coupled to the CPI 222 charge pump and a filter 320 coupled to the gating circuit 310 and the CPP 220, the filter 320 providing the voltage input 206 that is recognizable by the VCO 240. The LF 230 utilizes a dual path PLL architecture that separates the PLL 200 loop into an integral path 302 and a proportional path 304. The integral path 302 includes the integral charge pump CPI 222 operable to provide an integral charge pump current (CPII) 226 to a gate input 312 of the gating circuit 310. In an exemplary, non-depicted embodiment, the CPII 226 current may be provided as positive current pulses, negative current pulses or a combination thereof. Thus, a charge pump current may add or remove charges stored on a capacitor coupled to receive the charge pump current. The gating circuit 310 controls an amount of time the integral charge pump current CPII 226 received at the gate input 312 is allowed to pass through as an effective integral charge pump current (EFFI) 324 to a gate output 314. That is, the gating circuit 310 controls an amount of charge that is allowed to pass through from the CPI 222 to the filter 320 for performing integration.

The proportional path 304 includes the proportional charge pump CPP 220 operable to provide a proportional charge pump current (CPPI) 224 to the filter 320. The effective integral charge pump current EFFI 324 and the proportional charge pump current (CPPI) 224 are received by the filter 320, which is operable to filter out undesirable frequencies from the CPPI 224 and the effective integral charge pump current EFFI 324 and provide voltage input 206 to the VCO 240. In a particular embodiment, the currents provided by CPP 220 and CPI 222 charge pumps are configured to be substantially equal and balanced. Since the CPP 220 and CPI 222 charge pumps are sized to be the same, the effect of device mismatch and process variation are minimized.

The gating circuit 310 includes a first transmission gate T1 380 controlled by a digital control signal En 382 and an inverse thereof Enbar 384. In a particular embodiment, asserting the En 382 signal, e.g., to a logic high level, enables T1 380 and allows the integral charge pump current CPII 226 received at the gate input 312 to pass through as the effective integral charge pump current EFFI 324 to the gate output 314.

A fraction of the time the gate T1 380 is enabled defines a gating factor n, n being a ratio, e.g., 1 divided by an integer. Thus, the gating factor n is a ratio of the effective integral charge pump current EFFI 324 to the integral charge pump current CPII 226 integrated over p periods, p being an integer. For example, if the integral charge pump current CPII 226 includes 8 pulses measured over a configurable time interval, and the gating factor n is configured to be equal to ⅛, then the effective integral charge pump current EFFI 324 includes 1 pulse measured over the configurable time interval of 8 pulses. T1 380 is enabled to sample the integral charge pump current CPII 226 during 1 out of the 8 periods and disabled for 7 out of 8 periods to block flow of the integral charge pump current CPII 226 to the filter 320. Additional details of the timing aspects of the LF 230 are described with reference to FIG. 3C.

The gating circuit 310 also includes a series combination of a third buffer 392 and a second transmission gate T2 394. An input of the third buffer 392 is coupled to the gate output 314, an output of the third buffer 392 is coupled to an input of T2 394, and an output of T2 394 is coupled to the gate input 312. The second transmission gate T2 394 is digitally controlled by the inverse of the digital control signal Enbar 384 and the digital control signal En 382. Thus, T1 380 is blocked when T2 394 is conducting (or enabled) and T1 380 is conducting when T2 394 is blocked. In a particular embodiment, the third buffer 392 is a unity gain, high input impedance (to the filter 320), low output impedance buffer that enables voltage tracking. Specifically, the third buffer 392 enables a voltage at the gate input 312 to track a voltage at the gate output 314 in response to the second transmission gate T2 394 being enabled. Equalization of the voltages at the gate output 314 and the gate input 312 when T1 380 is blocked and T2 394 is enabled is desired to reduce or eliminate charge pump current error due to injection when T1 380 becomes enabled and T2 394 is blocked.

The filter 320 includes an integrating capacitor C 340, a first buffer 350, a resistor 360, a capacitor C2 370, and a second buffer 380. The effective integral charge pump current EFFI 324 is integrated by the integrating capacitor C 340 to provide a capacitor integrated effective integral charge pump current, the integrating capacitor C 340 being coupled between the gate output 314 and a voltage reference 390 such as ground. The integral path 302 also includes a first buffer 350. In an embodiment, the first buffer 350 is a unity gain, high input impedance, low output impedance buffer that enables voltage tracking. Specifically, a first buffer output (N2) 332 of the first buffer 350 is configured to track a voltage at the gate output 314. Thus, the integral path 302 includes CPI 222, gate input 312, T1 380, gate output 314, the integrating capacitor C 340, the first buffer 350, and N2 332. A voltage at N2 332 represents the integral control portion of the PLL 200 loop and corresponds to the capacitor integrated effective integral charge pump current and hence the charge stored on the integrating capacitor C 340. The 'frequency information' associated with the PLL 200 is provided as a voltage at N2 332.

The proportional path 304 includes the proportional charge pump (CPP) 220 operable to provide the proportional charge pump current (CPPI) 224 to the resistor R 360 and a capacitor C2 370 included in the filter 320, the R 360 and C2 370 being coupled at a second buffer input (N1) 372. In an exemplary, non-depicted embodiment, the CPPI 224 current may be provided as positive current pulses, negative current pulses or a combination thereof. Thus, a charge pump current may add or remove charges stored on a capacitor coupled to receive the charge pump current. The resistor R 360 is coupled between N2 332 and N1 372 and the capacitor C2 370 is coupled between N1 372 and the voltage reference 390. A direction of the flow of the proportional charge pump current CPPI 224, e.g., into R 360 or out of R 360, is dependent on the PLL error signal 204. Thus, if the PLL 200 loop needs to increase the VCO 240 frequency to a higher level, then the current in R 360 will flow from N1 372 to N2 332 (assuming the VCO 240 is configured to have a positive frequency sense). A voltage at N1 372 represents the proportional plus integral control portions of the PLL 200 loop corresponding to the proportional charge pump current CPPI 224 and the effective integral charge pump current EFFI 324. Thus, voltage at N1 372 represents both frequency and phase information about the PLL 200 loop. A second buffer 380 is coupled to N1 372 to receive the voltage at N1 372 and provide voltage input 206 to the VCO 240.

A damping factor zeta of the type 11 dual loop third order PLL 200 is defined by Equation 100 (ignores the effect of C2 370 that is designed to suppress reference spurs) as follows:

$$Zeta=(R/2)*SQRT[(Kpp*Kv*C)/(n*N)] \qquad \text{Equation 100}$$

The natural frequency Wn is defined by Equation 200:

$$Wn=SQRT[(Kip*Kv)/(N*C)] \qquad \text{Equation 200}$$

For a large damping factor zeta, a 3 dB bandwidth W-3 dB may be approximated by the Equation 300:

$$W\text{-}3\text{ dB approximately}=(Kpp*Kv*R)/N \qquad \text{Equation 300}$$

where R is resistor R 360, C is integrating capacitor C 340, Kpp is the gain factor in the proportional path, Kip is the gain factor in the integral path, Kv is the gain factor of the VCO 240, N is the feedback divide ratio, the gating factor n is the ratio between Kip and Kpp. That is, ratio of Kip/Kpp is equal to the gating factor n.

Referring to Equations 100, 200 and 300, the 3 dB bandwidth may be controlled by adjusting Kpp and the damping factor may be precisely controlled by the gating factor n. For a large damping factor zeta, the 3 dB bandwidth is virtually independent on the gating factor n and for smaller values of zeta the 3 dB bandwidth is weakly dependent on the gating factor n. Thus, the dual path architecture of the PLL 200 provides simultaneous control over bandwidth and damping (and hence peaking). The choice of selecting n is a digital control. That is, the ratio of the integral charge pump current CPPI 224 to the proportional charge pump current may be precisely configured to be equal to a desired fraction such as ½, ¼, ⅛, 1/16, 1/100 and similar others. The digital control enables resizing of the integral charge pump current CPII 226 to the effective integral charge pump current EFFI 324 by simply selecting n the gating factor. As described earlier, analog resizing techniques used to control integral charge pump current in the traditional PLL 100 also causes undesirable errors in the integral charge pump current due to device mismatch, process variation, and transistor current leakage. These undesirable effects are minimized and virtually eliminated by the digital controlling technique deployed by the PLL 200 described with reference to FIG. 2.

In a particular embodiment, the gating circuit 310 may include a divider 316 that is operable to divide a reference signal 318 by the factor (also referred to as a gating factor) p to provide a digital control signal En 382 (and the inverse thereof Enbar 384). For example, if the gating factor is configured to be equal to ¼, then the divider 310 asserts the En 382 signal for 1 out of very 4 pulses of the reference signal. It is desirable that the digital control signal En 382 is evenly distributed over a configurable time interval, e.g., over p periods. Uneven distribution, e.g., caused by having long off periods, may allow phase error to accumulate. The divider 316 is configured to receive a reference signal and provide En 382 and Enbar 384 signals in accordance with the gating factor n.

Figure 3C:
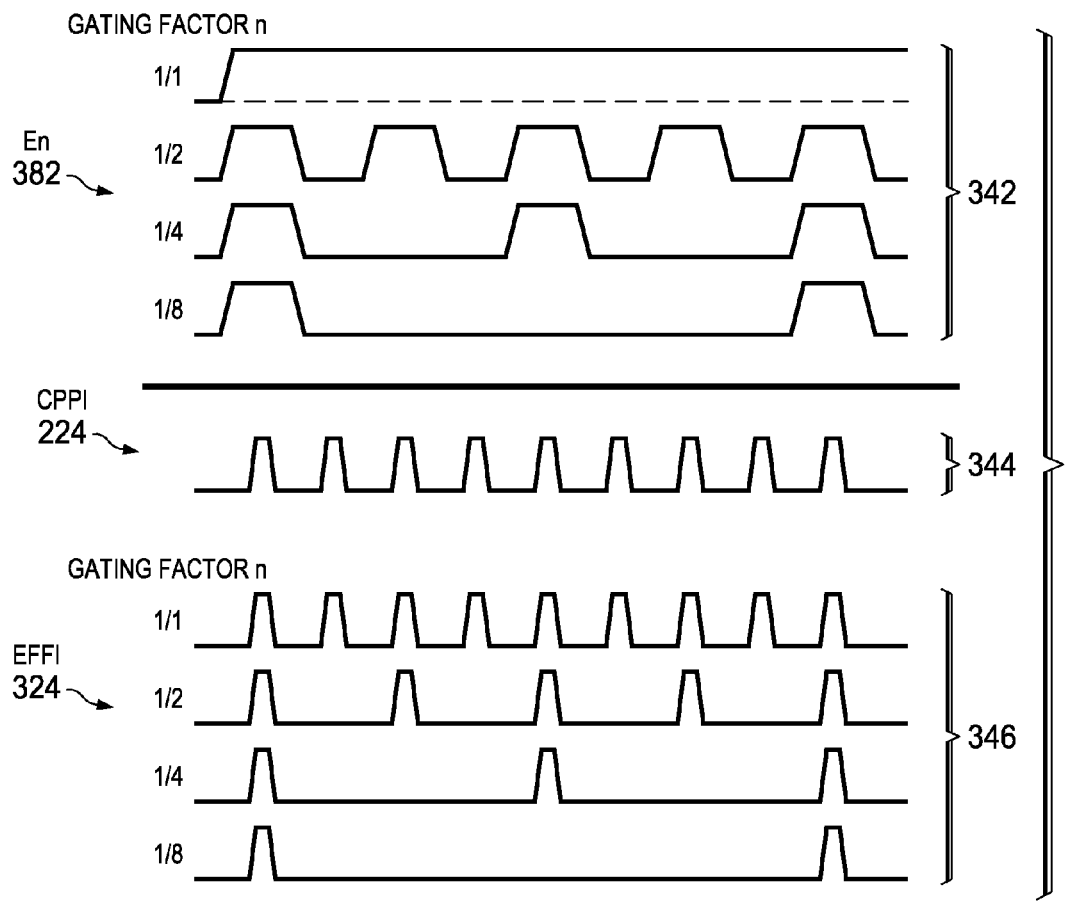
FIG. 3C is a timing diagram illustrating waveforms (or electronic signatures) associated with a LF described with reference to FIGS. 2, 3A, and 3B, according to an embodiment.
Figure 3B:
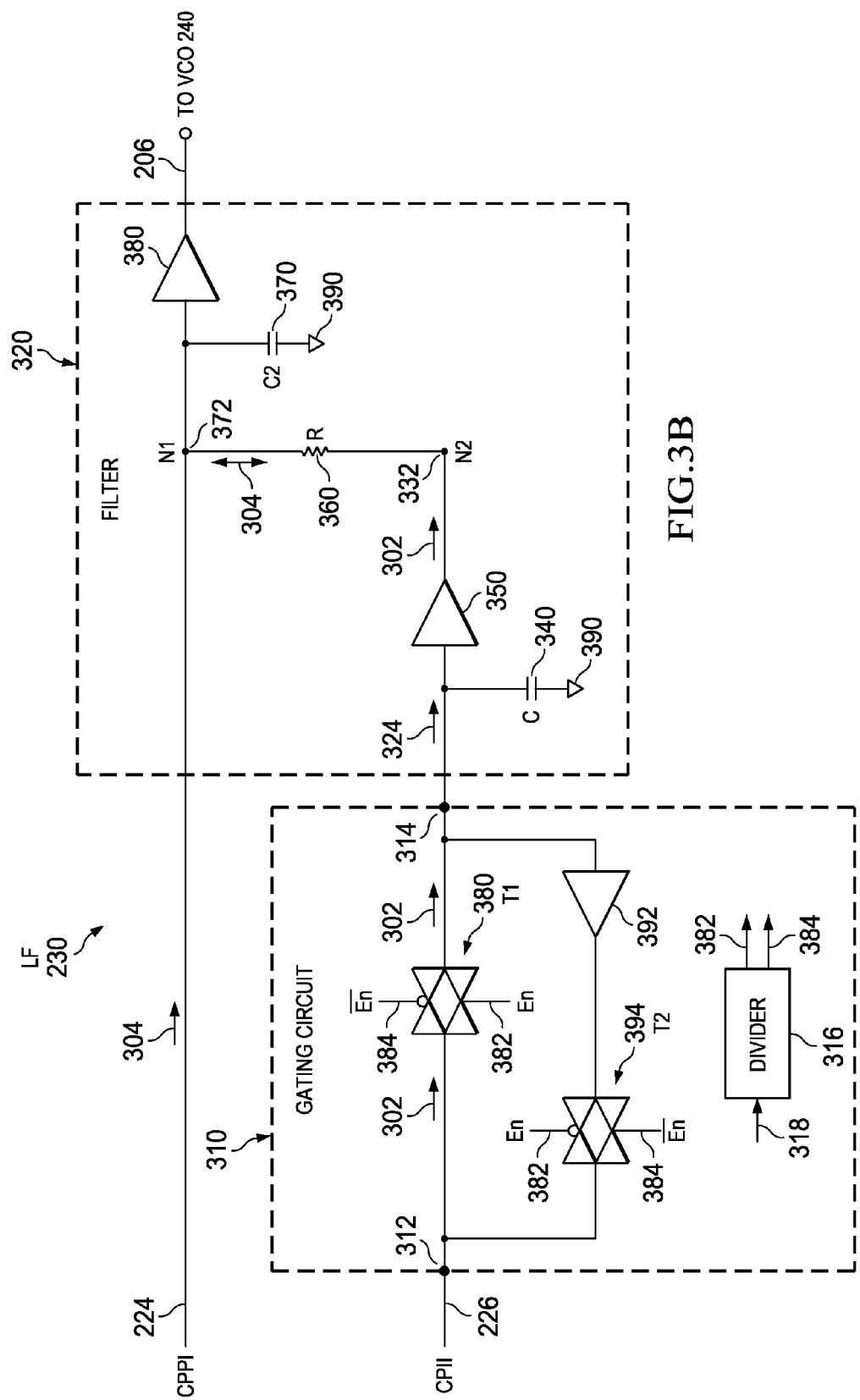
FIG. 3B is a simplified circuit diagram of a gating circuit and a filter included in a LF described with reference to FIG. 3A, according to an embodiment.

FIG. 3C is a timing diagram illustrating waveforms (or electronic signatures) associated with the LF 230 described with reference to FIGS. 2, 3A, and 3B, according to an embodiment. Waveform (or electronic signature) 342 illustrate the digital control signal En 382 provided by the divider 316 for various values of the gating factor n, including when n is ⅟₁, ½, ⅓, ¼ and ⅛. Waveform (or electronic signature) 344 illustrates the CPPI 224 current provided by the CPP 220 charge pump. Since CPI 222 and CPP 222 are configured to deliver equal charge pump currents, CPII 226 also has a waveform (not shown) similar to the waveform 344. Waveform (or electronic signature) 346 illustrates the effective integral charge pump current EFFI 324 provided to the filter 320 corresponding to n being configured to be equal to ⅟₁, ½, ⅓, ¼ and ⅛. Although waveforms 342, 344, and 346 are shown in the form of positive pulse signals, it is understood that the waveforms 342, 344, and 346 may include signals such as positive pulses, negative pulses, or a combination thereof. It is understood that the particular embodiment described by waveforms 342, 344, and 346 represent only one exemplary set of various waveform combinations that may be implemented to create a fractional integral charge pump current.

FIG. 4 includes tabular data illustrating effect of adjusting gating factor n and size of integrating capacitor on performance of PLL 200 described with reference to FIGS. 2, 3A, 3B, and 3C, according to an embodiment. The values illustrated in Tables 400, 440, and 450 may be derived using formulae, empirical data, test data, simulated data, and similar other. Table 400 illustrates a benchmarking comparison between PLL 100 (row 410) described with reference to FIG. 1 versus PLL 200 (rows 420 and 430) with respect to the 3 dB bandwidth and peaking performance. For the PLL 100, the 3 dB bandwidth is approximately equal to 780 kilohertz (kHz) and the peaking is approximately 1.53 dB. For the PLL 200 having the gating factor n adjusted for ¼, the 3 dB bandwidth decreases slightly from 780 kHz to 740 kHz, whereas there is a dramatic reduction in the peaking factor from 1.53 dB to 0.469 dB. In order to achieve a desired specification of 0.1 dB further adjustment of the gating factor n may be made. For the PLL 200 having the gating factor n adjusted for ⅟₁₆ (row 430), the 3 dB bandwidth decreases to 600 kilohertz, whereas there is a dramatic 10:1 reduction in the peaking factor from 1.53 dB to 0.156 dB.

The S domain analysis of the PLL 200 may be defined by a filter function in Equation 400. A forward gain equation for the PLL 200 is listed in Equation 500, and the corresponding closed loop gain is described in Equation 600.

$$F_1(s) = \frac{A_2 CRs + A_1}{CC_2 Rs^2 + Cs}$$ Equation 400

$$GX(s) = K_p F_1(s) \frac{K_v}{s}$$ Equation 500

$$Gclx(s) = \frac{GX(s)}{1 + GX(s)H_1}$$ Equation 600

The A2 value is the proportional gain and the A1 is the integral gain in these equations. Furthermore, the gating factor n=A1/A2, Kip=Kp*A1, and Kpp=Kp*A2. The S domain analysis using the values of components in Tables 440 and 450 demonstrates the advantages of using digital control techniques in a PLL. In order to simply the analysis for a third order PLL 200, the C2 370 loop capacitance is configured to have a very low value, e.g., 1 femto farad (fF). Rows 452 of Table 450 indicate the expected results for the PLL 100 described with reference to FIG. 1. The –3 dB bandwidth, the peaking magnitude and the peaking frequency increases as integrating capacitor is decreased from 1 nano farad (nF) to 250 pico farad (pF). Accordingly, the peaking shows that the higher 1 nF integrating capacitor C 340 is needed to reduce the peaking from 1.78 dB to 0.597 dB. Increasing the capacitance size however results in a significant increase in the silicon area/die size.

Rows 454 of Table 450 demonstrate the ability of the PLL 200 having digital control to reduce the peaking value from 0.597 dB to 0.177 dB by changing the dwell on the integral part from 100% to 25% of the time, e.g., by adjusting the gating factor n from ⅟₁ to ¼.

Rows 456 of Table 450 demonstrate the ability of the PLL 200 having digital control to reduce the peaking value from 1.78 db to 0.177 dB by changing the dwell on the integral part (gating factor n) from 100% to 6.25% of the time while using only a 250 pF integrating capacitor C 340. That is, for a constant value of peaking performance, PLL 200 uses a significantly smaller value of the integrating capacitor compared to the PLL 100. For example, to achieve a peaking of 0.597 dB the PLL 100 uses a 1 nF integrating capacitor, whereas to achieve the same peaking of 0.596 dB, the PLL 200 uses a gating factor of ¼, thereby resulting in using a much smaller integrating capacitor of 250 pF. This result contrasts very favorably with the rows 452 of Table 450 that only achieve a 0.597 dB peaking while using an extremely large 1 nF integrating capacitor. The digital control technique produces many of the same –3 dB bandwidths listed in the rows 452 of Table 450 as the integrating capacitor is changed.

It is understood that the digital control techniques used for controlling the current in the integral path 302 of the PLL 200 may also be used in conjunction with the analog programmability if desired.

Figure 5A:
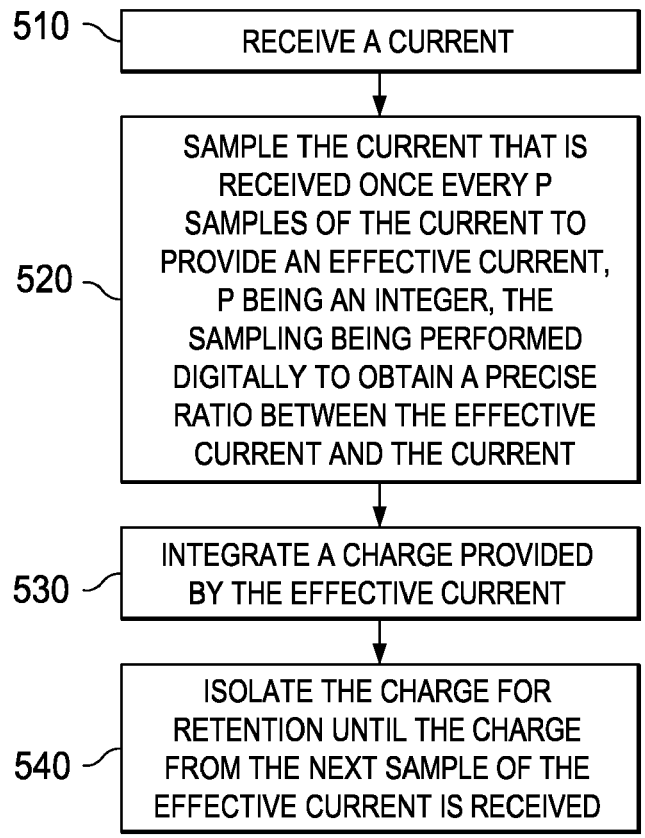
FIG. 5A is a flow chart illustrating a method for integrating a current in a loop filter, according to an embodiment, according to an embodiment.

FIG. 5A is a flow chart illustrating a method for integrating a current in a loop filter, according to an embodiment. In a particular embodiment, FIG. 5A illustrates the method for integrating a current passing through an integral path of a loop filter described with reference to FIGS. 2, 3A, 3B, 3C, and 4. At step 510, a current is received. At step 520, the current that is received is sampled once every p samples of the current to provide an effective current, p being an integer. The sampling is performed digitally to obtain a precise ratio between the effective current and the current. In a particular embodiment, the sampling includes controlling a transmission gate to enable the current to pass through one out of every p periods, the transmission gate being controlled by asserting a digital control signal. At step 530, a charge provided by the effective current is integrated. At step 540, the charge is isolated for retention until the charge from the next sample of the effective current is received.

Figure 5B:
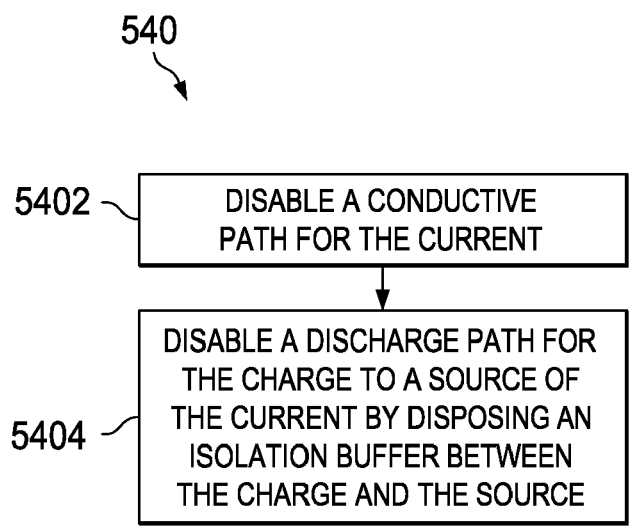
FIG. 5B is a flow chart illustrating a method for isolating a charge described with reference to step 540 in FIG. 5A, according to an embodiment.

Various steps described above may be added, omitted, combined, altered, or performed in different orders. For example, the step 540 may include additional steps 5402 and 5404. FIG. 5B is a flow chart illustrating a method for isolating the charge described with reference to step 540 in FIG. 5A, according to an embodiment. At step 5402, a conductive path for the current is disabled. At step 5404, a discharge path for the charge to a source of the current is disabled by disposing an isolation buffer between the charge and the source.

Several advantages are achieved by the method and apparatus according to the illustrative embodiments presented herein. The embodiments advantageously provide an improved apparatus and method for independent control of 3 dB bandwidth and digital control of damping of a dual path PLL without incurring a penalty in terms of silicon area/die size. The digital control for damping includes a gating circuit to control a fraction of the time (defined as a gating factor n) for which an integral charge pump current is passed through to an integrating capacitor of an RC circuit. The digital control for precisely controlling integral charge pump current flowing through the integral path is defined by selecting a value of n, n being a ratio of 1 divided by an integer. This provides accurate peaking of the PLL, thereby enabling compliance with stringent peaking specifications such as 0.1 dB or less. Compared to the traditional analog solution in a dual path PLL, the digital controls provide improved tolerance of the effective integral charge pump current that is less sensitive to device mismatch, process variation, and transistor current leakage. The improved loop filter draws identical currents from the proportional charge pump and the integral charge pump, thereby eliminating generation of very small charge pump currents or imbalanced currents that are more vulnerable to mismatch and process variation. The improved apparatus and method also provides the benefit of reducing the size of a capacitance used as an integrator, potentially reducing the silicon area of the capacitance by a factor of p or eliminating the need for a large value capacitor mounted external to the silicon device package. That is, by using digital controls for damping the silicon area/die size for an existing PLL circuit can be reduced by a factor of p without substantially impacting bandwidth and damping factor.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of digitally scaling or resizing a charge pump current used in a PLL, the digital scaling technique may be applied to precisely scale current provided by any current source in any electronic circuit. In addition to the PLL, the loop filter having the digital damping control may be used for, among other things, frequency synthesis, frequency multiplication, pulse synchronization, tone decoding, AM and FM modulation and demodulation, phase modulation and demodulation, and delta sigma modulation. These type of applications are widely used in communications (wired and wireless), and computers. In addition, it is understood that in some PLL applications the digital controls for damping may be deployed in addition to or in conjunction with the analog programmability techniques (e.g., analog resizing of the integral charge pump current). That is, digital control techniques for controlling damping described herein may be used co-operatively with the traditional analog programmability techniques.

The methods and apparatuses described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A loop filter comprising:
   a proportional path to conduct a proportional charge pump current;
   an integral path to conduct an integral charge pump current, the integral path including:
   a gating circuit to digitally control an amount of time the integral charge pump current is passed through as an effective integral charge pump current; and
   a filter to filter the effective integral charge pump current.

2. The loop filter of claim 1, wherein the filter comprises:
   an integrating capacitor coupled to the gate output to integrate the effective integral charge pump current and provide a capacitor integrated effective integral charge pump current;
   a first buffer having a first buffer output to track a voltage at the gate output;
   a resistor coupled to receive a proportional charge pump current, the resistor coupled between the first buffer output and a second buffer input; and
   a second buffer coupled to receive a voltage signal corresponding to the proportional charge pump current and the capacitor integrated effective integral charge pump current, the voltage signal being input at the second buffer input.

3. The loop filter of claim 2, wherein the filter further comprising:
   a filter capacitor coupled between the second buffer input and a reference voltage, the filter capacitor operable to filter out undesirable frequencies from the proportional charge pump current.

4. The loop filter of claim 1, wherein the gating circuit further comprises:
   a first transmission gate coupled between a gate input and a gate output, the first transmission gate being digitally controlled by a digital control signal; and
   a series combination of a third buffer and a second transmission gate, the series combination coupled between the gate output and the gate input, the second transmission gate being digitally controlled by an inverse of the digital control signal, the third buffer enabling a voltage at the gate input to track a voltage at the gate output in response to the second transmission gate being enabled.

5. The loop filter of claim 4, wherein the first transmission gate is enabled to sample the integral charge pump current and disabled to block flow of the integral charge pump current to the integrating capacitor.

6. The loop filter of claim 4, wherein the second transmission gate is enabled when the first transmission gate is disabled, wherein the second transmission gate when enabled reduces error due to a charge injection of an integral charge pump.

7. The loop filter of claim 1, wherein a ratio of the effective integral charge pump current to the integral charge pump current integrated over p periods is defined as a gating factor, p being an integer.

8. The loop filter of claim 7, wherein a damping factor zeta of the loop filter is precisely controlled by selecting a value for the gating factor.

9. The loop filter of claim 8, wherein for a constant value of the damping factor zeta a silicon area to fabricate the capacitor is reduced by p.

10. The loop filter of claim 1, wherein the integral path has an integral gain factor and the proportional path has a proportional gain factor, a ratio between the integral gain factor and the proportional gain factor being equal to the gating factor n.

11. The loop filter of claim 10, wherein a 3 dB bandwidth of the loop filter is controlled by adjusting the proportional gain factor.

12. The loop filter of claim 1 further comprising:
a divider operable to divide a reference signal by the gating factor n to provide a digital control signal, the digital control signal being evenly distributed over a configurable time interval.

13. The loop filter of claim 1, wherein the integral charge pump current is configured to be equal to the proportional charge pump current, thereby limiting impact due to device mismatch and process variation.

14. A method for integrating a current, the method comprising:
receiving the current;
sampling one of every p samples of the current to provide an effective current, p being an integer, the sampling being performed digitally to obtain a precise ratio between the effective current and the current;
integrating a charge provided by the effective current; and
isolating the charge for retention,
wherein the isolating includes: disabling a conductive path for the current; and disabling a discharge path for the charge to a source of the current by disposing a buffer between the charge and the source.

15. The method of claim 14, wherein the precise ratio is equal to 1/p.

16. The method of claim 14, wherein the sampling includes:
controlling a transmission gate to enable the current to pass through one out of every p periods, the transmission gate being controlled by asserting a digital control signal.

17. A method for integrating a current, the method comprising:
receiving the current;
sampling one of every p samples of the current to provide an effective current, p being an integer, the sampling being performed digitally to obtain a precise ratio between the effective current and the current;
wherein the current is received from a charge pump included in a phase lock loop (PLL), wherein a damping factor zeta of the PLL is precisely controlled by selecting a value for p.

18. The method of claim 17, wherein the precise ratio is equal to 1/p.

19. The method of claim 17, wherein the sampling includes:
controlling a transmission gate to enable the current to pass through one out of every p periods, the transmission gate being controlled by asserting a digital control signal.

20. A phase locked loop (PLL) having a digitally adjustable damping, the PLL comprising:
a phase frequency detector (PFD) operable to detect a difference in phase and frequency between a feedback signal and an input reference, the PFD generating an error signal in response to the difference;
a dual charge pump operable to provide a proportional current that is approximately equal in value with an integral current;
a loop filter including:
a proportional path operable to conduct the proportional current;
an integral path operable to conduct the integral current, the integral path including a gating circuit to digitally control an amount of time the integral current received is passed through as an effective integral current;
a filter operable to filter the proportional current and the effective integral current, thereby providing a filtered input; and
a voltage controlled oscillator (VCO) coupled to receive the filtered input and provide an output signal locked in phase and frequency of the input reference, the feedback signal being derived from the output signal.

* * * * *